United States Patent [19]

Joshi

[11] Patent Number: 4,751,101
[45] Date of Patent: Jun. 14, 1988

[54] LOW STRESS TUNGSTEN FILMS BY SILICON REDUCTION OF WF$_6$

[75] Inventor: Rajiv V. Joshi, Yorktown Heights, N.Y.

[73] Assignee: International Business Machines Corporation, Armonk, N.Y.

[21] Appl. No.: 44,262

[22] Filed: Apr. 30, 1987

[51] Int. Cl.$^4$ .................. B05D 3/06; B05D 5/12; C23C 15/00
[52] U.S. Cl. .................. 427/39; 427/124; 427/253; 437/228; 437/245; 437/187; 437/173
[58] Field of Search .................. 427/124, 39, 253; 437/187, 192, 203, 228, 245

[56] References Cited

U.S. PATENT DOCUMENTS

| | | | |
|---|---|---|---|
| 3,697,342 | 10/1972 | Cuomo | 156/13 |
| 3,881,242 | 5/1975 | Nuttall et al. | 29/589 |
| 4,452,828 | 6/1984 | Namba et al. | 427/39 |
| 4,540,607 | 9/1985 | Tsao | 427/253 |
| 4,552,783 | 11/1985 | Stoll et al. | 427/91 |
| 4,565,157 | 1/1986 | Brors et al. | 118/719 |
| 4,584,207 | 4/1986 | Wilson | 427/124 |

Primary Examiner—Norman Morgenstern
Assistant Examiner—Margaret Burke
Attorney, Agent, or Firm—Jeffrey S. LaBaw; Maurice H. Klitzman; T. J. Kilgannon

[57] ABSTRACT

A method is described for depositing thick, low-stress refractory metal films on a substrate. For example, a layer of tungsten of any required thickness may be deposited by the silicon reduction of tungsten hexafluoride in a CVD reactor. This is accomplished by alternating the process step of plasma depositing an amorphous silicon film, with the process step of exposing the silicon film to tungsten hexafluoride until the required thickness of tungsten is reached. The thickness of the deposited amorphous silicon film must be less than the thickness at which the replacement of silicon to tungsten becomes self-limiting to assure that all of the amorphous silicon is replaced. The bombardment of the silicon during plasma deposition "hammers" the underlying tungsten film and relieves the stress in the film.

15 Claims, No Drawings

LOW STRESS TUNGSTEN FILMS BY SILICON REDUCTION OF WF$_6$

BACKGROUND OF THE INVENTION

This invention relates generally to the deposition of conductive films on a substrate. More particularly, it relates to chemical vapor deposition methods for forming relatively thick refractory metal films on a semiconductor surface.

In the development of VLSI technology, there is a continuous trend to reduce the dimensions of the microelectronic devices present on the semiconductor chip and in this way increase the speed of operation. In the microelectronics industry, refractory metals, such as tungsten and molybdenum, have been studied for use as conducting films, however, current deposition technologies suffer from several disadvantages.

Refractory metals for VLSI applications are generally applied according to one of three different methods: sputtering, evaporation, and chemical vapor deposition. The primary advantage of a sputtering or evaporation process is the ability to apply most metals, rather than only the group which have volatile reaction products. However, sputtering and evaporation often require complicated and expensive equipment and are prone to nonuniform coverage when topology is severe over the wafer.

Chemical vapor deposition (CVD) of refractory metals offers several advantages over sputtering and evaporation. CVD of refractory metals can provide better coverage, reduced system complexity, and higher purity deposits. Also in some applications, selective CVD does not require an additional photolithography step. The selective chemical vapor deposition process is a process in which the refractory metal, or other material, is deposited only on areas with certain chemical reactivities. For example, tungsten hexafluoride will react with silicon or polysilicon gates, but not with the surrounding silicon dioxide isolation areas.

However, tungsten films formed in the past by CVD methods have suffered from a number of limitations. Tungsten films formed by the hydrogen reduction of tungsten hexafluoride, according to the equation,

$$3H_2 + WF_6 \rightarrow W + 6HF \uparrow \quad (1)$$

produce hydrofluoric acid as a by-product. This is undesirable since the HF tends to etch away the silicon dioxide area surrounding the polysilicon gate, potentially destroying the device. The thickness of films produced by this method is difficult to reproduce under the best of conditions, and the film surface is frequently rough. The tungsten films formed by the hydrogen reduction method are highly stressed which can cause delamination of the films from the substrate. Deposition rates are relatively slow using this method; 30 to 50 angstroms of tungsten is deposited per minute at temperatures below 400 degrees centigrade. A slow rate is relatively disadvantageous when a thick tungsten film is desired. Also, after 1000 A have been deposited, the process is no longer selective, and tungsten will deposit on the silicon dioxide or other surrounding areas.

Tungsten films have also been formed by the silicon reduction of tungsten hexafluoride according to the equation.

$$2WF_6 + 3Si \rightarrow 2W + 3SiF_4 \uparrow \quad (2)$$

The by-product from this reaction is silicon tetrafluoride which is volatile but generally nonreactive with semiconductor materials. Also, the rate of deposition is much greater than that for the hydrogen reduction process, on the order of 500 to 600 angstroms of tungsten deposited per minute. However, this reaction has two major disadvantages. First, like the hydrogen reduction method, the films produced by this method are highly stressed. When the silicon atom is replaced tungsten by WF6, the larger tungsten atoms introduce stress in the film. Second, the silicon reduction method requires that silicon be available in order for the reaction to take place. As the tungsten is deposited, less and less silicon is available from the underlying area. This causes the reaction to be self-limiting, typically only films of 300 to 400 angstroms can be deposited. One prior art method discloses that an argon plasma treatment may be used to increase nucleation sites on the silicon for tungsten deposition, and thereby increasing the available silicon. However, this technique will only extend the silicon reduction method to form films of approximately 1000 angstroms. Beyond this thickness, other means of depositing tungsten are required.

SUMMARY OF THE INVENTION

Therefore, it is an object of the present invention to deposit refractory metal layers on semiconductor surfaces in an improved manner.

It is another object of this invention that the refractory metal deposited be smooth and have low stress, and thus less subject to delamination.

It is yet another object of this invention that the deposition of the refractory metal be performed at a relatively high rate.

It is still another object of the invention that the thickness of refractory metal deposited not be limited by the availability of silicon on the substrate.

These and other objects will be apparent from the detailed descriptions which follow.

This invention provides a method for depositing low stress blanket tungsten films at rates 3 to 4 times higher than conventional CVD processes at temperatures below 400 degrees centigrade. In the first step of the method, a silicon substrate is provided. In the second step, tungsten hexafluoride is passed over the silicon substrate forming volatile silicon tetrafluoride and a self-limited layer of tungsten. In the third step of the process, silane or disilane is decomposed using RF power to produce silicon and a plasma is ignited at the same time. A layer of amorphous silicon (Si:H) is produced. This layer is then replaced by tungsten by repeating the second step of passing tungsten hexafluoride over the silicon. To assure all of the silicon is converted to tungsten, the silicon layer is limited to a thickness less than the self-limiting thickness. The third step of plasma depositing an amorphous silicon layer, and the second step of exposing the silicon to tungsten hexafluoride are repeated until the desired thickness is reached.

DETAILED DESCRIPTION OF THE INVENTION

Preferred embodiments of the invention will now be described.

There are three major types of process steps to deposit a refractory metal film in accordance with this invention. First, the initial area of silicon is provided; second, exposing this area to a refractory metal hexafluoride, such as tungsten hexafluoride, thereby replacing a portion of the silicon by tungsten; and third, plasma depositing a second layer of silicon. This silicon layer is of a thickness less than the thickness at which the reaction becomes self limiting. The exposing and plasma depositing steps are subsequently repeated until the desired metal film thickness is attained.

There are at least three methods of providing the initial silicon area. First, a bare silicon wafer could be placed in the reaction chamber if a uniform layer of tungsten is desired across the wafer. In the second, and more likely case, that the silicon substrate already has patterned areas as a result of prior processing, some of these areas being silicon and some being insulator surfaces. In the case where tungsten deposition is desired in areas where there is no silicon available for reaction with the refractory metal hexafluoride, e.g. silicon dioxide isolation areas or on top of a gallium arsenide device, patterned silicon can be deposited substrate through plasma or sputter deposition processes.

The second step of exposing this area to a refractory metal hexafluoride such as tungsten hexafluoride is performed in a known CVD reactor, such as that disclosed in commonly assigned U.S. Pat. No. 4,617,087. Once a few angstroms of tungsten is formed, the subsequent reaction proceeds by the reactant, $WF_6$, diffusing through the deposited tungsten film to the silicon to react chemically to form tungsten and silicon fluoride. At a certain film thickness, the tungsten acts as a diffusion barrier which prevents further reaction. In the absence of prior surface treatment, the self-limiting film thickness has been found to be between 300–400 angstroms of tungsten.

When silicon is exposed to tungsten hexafluoride and thereby replaced by tungsten, the larger size tungsten atoms introduce stress into the film. High film stress frequently causes delamination of the tungsten from substrate. It is found that plasma depositing silicon is one means of relieving the stress. When the overlying layer of silicon is deposited over the tungsten by plasma deposition, the bombardment of the silicon against the tungsten film relieves the stress in the film, in effect hammering the stress out.

In one embodiment of the invention, a prepatterned silicon substrate is exposed to 15 sccm tungsten hexafluoride for 2 minutes at 200 mT and 360 degrees Centigrade inside a a typical CVD reactor. This forms the self-limiting thickness of 300–400 angstroms of tungsten.

The tungsten hexafluoride flow is reduced to zero. Amorphous silicon is then deposited by RF plasma decomposition of silane. Silane flow of 400 sccm at 200 mT and 360 degrees Centigrade is maintained in an RF plasma of 200 watts for 60–120 sec. Total silicon deposited is limited to less than the self-limiting thickness to assure that all silicon will be replaced by tungsten in succeeding processing.

The amorphous silicon is then exposed to tungsten hexafluoride for 240 to 300 seconds at 200 mT and 360 degrees Centigrade and converted to tungsten.

The steps of plasma depositing amorphous silicon and exposing the silicon to tungsten hexafluoride are then repeated until the desired thickness of tungsten is reached.

If nonselective process conditions are chosen, the tungsten is then patterned into the desired configuration by conventional photolithography and dry metal etch techniques.

In the above embodiment, the tungsten hexafluoride flow of 15 sccm at 200 mT was used. The subject invention contemplates, however, that acceptable tungsten hexafluoride flows range from 15 sccm to 30 sccm at 150 mT to 250 mT. Temperature in the reaction chamber may vary from 315 to 400 degrees Centigrade and exposure time to tungsten hexafluoride may range from 200 to 300 seconds.

Similarly, the subject invention contemplates that silane flow may vary between 200 and 600 sccm at 150 to 250 mT. Acceptable temperature may range from 315 to 400 degrees Centigrade. The total deposition time may last from 600 to 800 seconds to form 2000 angstroms of adherent film.

Those skilled in the art will recognize that these operating conditions may vary if less optimal results can be tolerated and may vary considerably if another CVD reactor were used.

The present invention is particularly suited for FET gate structures. Tungsten replaces polysilicon over the gate area to provide a, low resistance contact.

Since the process takes place at relatively low temperatures, it is also readily adaptable to gallium arsenide devices. Some materials otherwise suitable for gate structures, notably metal silicides, require a high temperature anneal to obtain the necessary low resistivity. High temperatures are not generally compatible with gallium arsenide technology. Since there is no silicon on the gallium arsenide wafer, the initial layer of silicon must be deposited, preferably plasma deposited, to form a tungsten gate on gallium arsenide in accordance with the principles of this invention.

While the above discussion has been directed to the deposition of tungsten, other refractory metals, such as molybdenum may be deposited in a like manner, i.e. molybdenum hexafluoride would be used in the place of tungsten hexafluoride. Experiments have not been performed for other refractory metals, however, from prior art results it is apparent that the results would be similar to tungsten. Other refractory metals or (other metals in general) may be deposited on silicon through silicon reduction of gaseous refractory metal compounds in CVD processes.

While the invention has been described with respect to particular embodiments above, it would be understood by those skilled in the art that modifications may be made without departing from the spirit and scope of the present invention. These embodiments are for purposes of example and illustration only and are not to be taken to limit the scope of the invention narrower than the scope of the appended claims.

I claim:

1. A method for providing low stress refractory metal layers selected from the group consisting of tungsten and molybdenum on a substrate comprising the steps of:

providing an initial area of silicon material on said substrate, exposing said initial area of silicon material to a gaseous refractory metal hexafluoride selected from the group consisting of tungsten hexafluoride and molybdenum hexafluoride to replace at least the surface of said silicon material with said refractory metal, depositing a subsequent layer of said silicon material on said refractory metal using plasma deposition such that the bombardment of silicon ions reduces stress in said refractory metal layer, said silicon layer having a thickness less than the thickness at which the replacement of said silicon to said refractory metal becomes self limiting; and, exposing said layer of silicon material to said gaseous refractory metal hexafluoride to replace said silicon material with said refractory metal.

2. A method as recited in claim 1 further including the step of repeating said depositing and said exposing steps and concluding with said exposing step for a number of times sufficient to provide a refractory metal layer of desired thickness.

3. A method as recited in claim 1 wherein the step of providing an initial area of silicon material includes the steps of:

masking the surface of the substrate of said silicon material.

4. A method as recited in claim 1 wherein the step of providing an initial area of silicon material includes the step of:

depositing another layer of said silicon material on the surface of the substrate.

5. A method according to claim 4 wherein said initial area of silicon has a thickness less than the thickness at which the replacement of said silicon to a refractory metal, upon exposure to said refractory metal hexafluoride, becomes self limiting.

6. A method according to claim 3 further including the steps of repeating said exposing and depositing steps and concluding with an exposing step for a number of times sufficient to provide a refractory metal of desired thickness.

7. A method according to claim 4 further including the steps of repeating said exposing and depositing steps and concluding with an exposing step for a number of times sufficient to provide a refractory metal of desired thickness.

8. A method as recited in claim 4 wherein the step of providing an initial area of silicon material includes the step of:

masking the surface of said deposited layer of silicon material.

9. A method as recited in claim 1 wherein said initial area of silicon material is selected from the group of single crystal silicon, polycrystalline silicon, and amorphous silicon.

10. A method as recited in claim 1, wherein said plasma deposited silicon layer is a plasma deposited amorphous silicon film formed by the introduction of a gaseous silicon containing compound into a plasma discharge.

11. A method as recited in claim 4, wherein said layer of deposited silicon material is plasma deposited amorphous silicon.

12. A method as recited in claim 1, wherein said gaseous refractory metal hexafluoride is selected from the group of tungsten hexafluoride and molybdenum hexafluoride.

13. A method as recited in claim 4 wherein the substrate is selected from the group of single crystalline silicon, polycrystalline silicon, and gallium arsenide.

14. A method of providing low stress, and fine grained tungsten films comprising the steps of:

providing an initial area of silicon material, exposing said initial area of silicon material to tungsten hexafluoride to replace at least the surface of said region with a tungsten layer, plasma depositing a layer of amorphous silicon on said tungsten layer, such that the bombardment of silicon ions reduces stress in said tungsten layer, said amorphous silicon layer having a thickness less than the thickness at which the replacement of silicon with tungsten becomes self limiting; and, exposing said amorphous silicon layer to tungsten hexafluoride to replace said amorphous silicon layer with tungsten.

15. A method as recited in claim 14 further including the step of repeating said exposing and said plasma depositing steps and concluding with said exposing step for a number of times sufficient to provide a tungsten layer of desired thickness.

* * * * *

UNITED STATES PATENT AND TRADEMARK OFFICE
CERTIFICATE OF CORRECTION

PATENT NO. : 4,751,101

DATED : June 14, 1988

INVENTOR(S) : Rajiv V. Joshi

It is certified that error appears in the above-identified patent and that said Letters Patent is hereby corrected as shown below:

In the Claims:

Col. 6, lines 13-16    Delete "12. A method as recited in claim 1, wherein said gaseous refractory metal hexafluoride is selected from the group of tungsten hexafluoride and molybdenum hexafluoride."

Signed and Sealed this

Sixth Day of December, 1988

Attest:

DONALD J. QUIGG

*Attesting Officer*    *Commissioner of Patents and Trademarks*